US011581501B2

(12) United States Patent
Kim et al.

(10) Patent No.: US 11,581,501 B2
(45) Date of Patent: Feb. 14, 2023

(54) ELECTRONIC DEVICE AND PRODUCTION METHOD THEREOF

(71) Applicants: SAMSUNG ELECTRONICS CO., LTD., Suwon-si (KR); THE TRUSTEES OF THE UNIVERSITY OF PENNSYLVANIA, Philadelphia, PA (US)

(72) Inventors: Tae Gon Kim, Hwaseong-si (KR); Tianshuo Zhao, Philadelphia, PA (US); Nuri Oh, Philadelphia, PA (US); Cherie Kagan, Philadelphia, PA (US); Eun Joo Jang, Suwon-si (KR); Christopher Murray, Philadelphia, PA (US)

(73) Assignees: SAMSUNG ELECTRONICS CO., LTD., Gyeonggi-do (KR); THE TRUSTEES OF THE UNIVERSITY OF PENNSYLVANIA, Philadelphia, PA (US)

( * ) Notice: Subject to any disclaimer, the term of this patent is extended or adjusted under 35 U.S.C. 154(b) by 218 days.

(21) Appl. No.: 16/441,660

(22) Filed: Jun. 14, 2019

(65) Prior Publication Data

US 2019/0393435 A1 Dec. 26, 2019

Related U.S. Application Data

(60) Provisional application No. 62/687,765, filed on Jun. 20, 2018.

(51) Int. Cl.
*H01L 51/42* (2006.01)
*B82Y 30/00* (2011.01)
*H01L 31/0232* (2014.01)

(52) U.S. Cl.
CPC ............ *H01L 51/426* (2013.01); *B82Y 30/00* (2013.01); *H01L 31/0232* (2013.01)

(58) Field of Classification Search
None
See application file for complete search history.

(56) References Cited

U.S. PATENT DOCUMENTS 8,546,853 B2   10/2013   Tian et al.
9,315,896 B2   4/2016    Pore et al.
(Continued)

FOREIGN PATENT DOCUMENTS

| KR | 20100035466 A | 4/2010 | |
|---|---|---|---|
| KR | 20140117204 A | 10/2014 | |
| KR | 20170007641 A | 1/2017 | |
| WO | WO-2018222678 A1 * | 12/2018 | ............ C09K 11/025 |

OTHER PUBLICATIONS

Notice of Allowance dated Nov. 12, 2020 of the corresponding U.S. Appl. No. 16/441,574.
(Continued)

*Primary Examiner* — Shannon M Gardner
(74) *Attorney, Agent, or Firm* — Cantor Colburn LLP

(57) ABSTRACT

An electronic device and a production method thereof, wherein the electronic device includes: a semiconductor layer comprising a plurality of quantum dots; and a first electrode and a second electrode spaced apart from each other; wherein the plurality of quantum dots do not comprise cadmium, lead, or mercury; wherein the plurality of quantum dots comprise indium and optionally gallium; a Group VA element, wherein the Group VA element comprises antimony, arsenic, or a combination thereof, and a molar ratio of the Group VA element with respect to the Group IIIA metal (e.g., indium) is less than or equal to about 1.2:1, and wherein the semiconductor layer may be disposed between the first electrode and the second electrode.

21 Claims, 17 Drawing Sheets

(56) References Cited

U.S. PATENT DOCUMENTS

| | | |
|---|---|---|
| 9,343,301 B2 | 5/2016 | Harris et al. |
| 9,517,936 B2 | 12/2016 | Jeong et al. |
| 9,790,425 B2 | 10/2017 | Mcdaniel |
| 2002/0017656 A1* | 2/2002 | Graetzel ............... H01G 9/2009 257/184 |
| 2012/0052006 A1 | 3/2012 | Boyes et al. |
| 2014/0155640 A1 | 6/2014 | Pickett et al. |
| 2017/0218264 A1 | 8/2017 | Klimov et al. |
| 2018/0016495 A1* | 1/2018 | Kim .................. C09K 11/7492 |
| 2018/0375046 A1 | 12/2018 | Lee et al. |

OTHER PUBLICATIONS

Christopher M. Evans et al., "Synthesis and Use of Tris(trimethylsilyl)antimony for the Preparation of InSb Quantum Dots," Chemistry of Materials, Sep. 23, 2008, pp. 5727-5730, vol. 20, No. 18.

Maksym Yarema et al., "Colloidal Synthesis of InSb Nanocrystals with Controlled Polymorphism Using Indium and Antimony Amides," Chemistry of Materials, Apr. 3, 2013, pp. 1788-1792, vol. 25.

Soong Ju Oh et al., "Designing High-Performance PbS and PbSe Nanocrystal Electronic Devices through Stepwise, Post-Synthesis, Colloidal Atomic Layer Deposition," Nano Letters, Feb. 6, 2014, pp. 1559-1566, vol. 14.

Wenyong Liu et al., "Colloidal InSb Nanocrystals," Journal of the American Chemical Society, Dec. 2, 2012, pp. 20258-20261, vol. 134.

\* cited by examiner

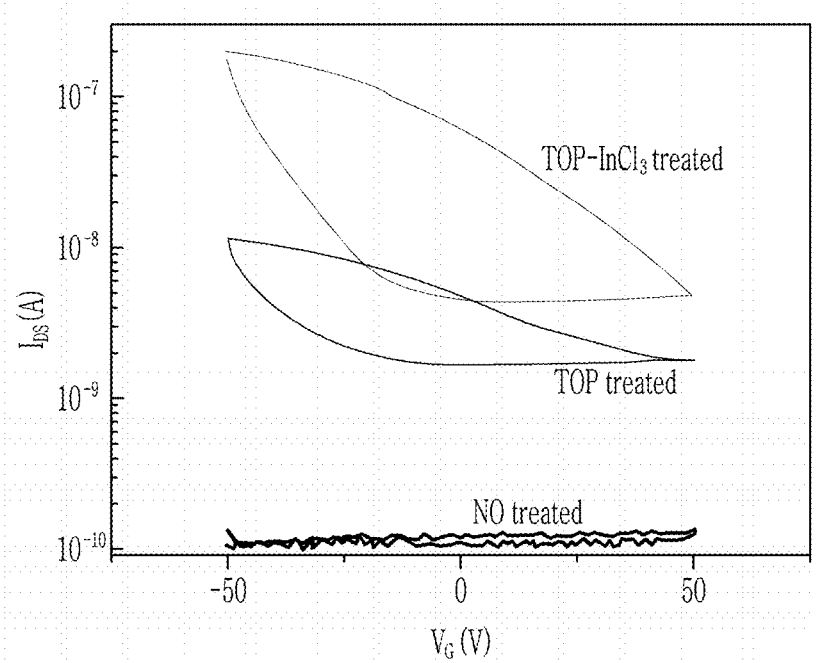

ELECTRONIC DEVICE AND PRODUCTION METHOD THEREOF

CROSS-REFERENCE TO RELATED APPLICATION

This application claims priority to and the benefit of U.S. Provisional Patent Application No. 62/687,765 filed on Jun. 20, 2018, the content of which in its entirety is herein incorporated by reference.

BACKGROUND

1. Field

An electronic device and a production method thereof are disclosed.

2. Description of the Related Art

Unlike bulk materials, physical characteristics (e.g., energy bandgap and melting point) of nanocrystal particles that are intrinsic may be controlled by changing the sizes of the nanocrystal particles. For example, a semiconductor nanocrystal (also known as a quantum dot) is a semiconductor material having a crystalline structure of a size of several nanometers. The semiconductor nanocrystal has a relatively small size and a relatively large surface area per unit volume and the semiconductor nanocrystal may exhibit a quantum confinement effect. Therefore, the semiconductor nanocrystal has different physicochemical characteristics than the bulk material having the same composition. For example, the energy bandgap of a quantum dot may be controlled by changing the size and composition of the quantum dot and thereby the quantum dot may emit light of high color purity with different wavelengths. Therefore, quantum dots may be used in various fields such as display, energy, electronic, and/or biological technologies.

Quantum dots based on cadmium, lead, or mercury may exhibit enhanced optical properties, but toxic heavy metals included therein may pose a serious threat to the environment. Thus, it may be desired to develop a quantum dot that may exhibit enhanced luminous properties without including a toxic heavy metal.

SUMMARY

An embodiment provides an indium based quantum dot exhibiting enhanced light emitting properties and not including a toxic heavy metal.

An embodiment provides a method of producing the indium based quantum dot.

An embodiment provides a method of fabricating the indium based quantum dot thin film with surface treatments both in the solution phase and in the solid-state.

An embodiment provides a film including the indium based quantum dot and an electronic device including the same.

In an embodiment, an electronic device includes a semiconductor layer including a plurality of quantum dots; and a first electrode and a second electrode spaced apart from each other;

wherein the plurality of quantum dots include a Group IIIA-VA compound including a Group IIIA metal and a Group VA element and do not include cadmium, lead, or mercury, wherein the Group IIIA metal includes indium and optionally gallium, aluminum, or a combination thereof; and the Group VA element includes antimony, arsenic, or a combination thereof, and a molar ratio of the Group VA element with respect to the Group IIIA metal is less than or equal to about 1.2:1, and the semiconductor layer is disposed between the first electrode and the second electrode.

The semiconductor layer may be electrically connected to the first electrode and the second electrode.

The molar ratio of the Group VA element with respect to the Group IIIA metal may be greater than or equal to about 0.8:1.

The semiconductor layer may include an alkylammonium halide, a carboxylic acid compound including a thiol group, a thiocyanate (SCN) compound, alkali metal sulfide ($Na_2S$), an alkali azide, or a combination thereof.

The semiconductor layer may include alkali metal sulfide ($Na_2S$) and an alkali azide, The alkylammonium halide may include an alkylammonium iodide. The alkylammonium iodide may include tetrabutylammonium iodide. The carboxylic acid compound may include mercapto propionic acid. The thiocyanate (SCN) compound may include $NH_4SCN$. The alkali azide compound may include sodium azide.

The plurality of quantum dots may have a surface treated with trioctylphosphine (TOP)-indium halide.

The plurality of quantum dots may further include phosphorous, and a molar ratio of the phosphorous with respect to the Group VA element may be greater than about 0.011:1.

The molar ratio of the phosphorous with respect to the Group VA element may be less than or equal to about 0.1:1.

In the plurality of quantum dots, a molar ratio of the Group VA element with respect to the Group IIIA metal (e.g., indium) may be less than about 1.13:1.

In the plurality of quantum dots, a molar ratio of the Group VA element with respect to the Group IIIA metal may be greater than about 1:1.

The molar ratio of the Group VA element with respect to the Group IIIA metal may be greater than about 1.12:1.

The plurality of quantum dots may have a size distribution of less than about 15% of an average size thereof.

The plurality of quantum dots may have a size distribution of less than about 10% of an average size thereof.

The plurality of quantum dots have a zinc-blend crystalline structure.

The plurality of quantum dots do not have a wurtzite crystalline structure.

The plurality of quantum dots may include InSb, InAs, $InAs_xSb_{1-x}$, $In_yGa_{1-y}Sb$, $In_xGa_{1-x}As_ySb_{1-y}$, or a combination thereof wherein x is greater than 0 and less than 1 and y is greater than 0 and less than 1.

The plurality of quantum dots (or the Group VA element) may include antimony (Sb) and arsenic (As). The plurality of quantum dots (or the Group VA element) may not include nitrogen.

In the quantum dots, a molar ratio of the antimony with respect to the arsenic may be greater than or equal to about 0.1:1 or greater than or equal to about 0.13:1 and less than or equal to about 9:1, or less than or equal to about 7.5:1, for example, as determined by an energy dispersive spectroscopic analysis.

The semiconductor layer may be configured to exhibit a responsivity of greater than or equal to about $3 \times 10^{-3}$ amperes per watt when being irradiated with light of a wavelength of about 1.55 micrometers (μm).

The semiconductor layer may be configured to exhibit an external quantum efficiency of greater than or equal to about $2 \times 10^{-3}$ (i.e., greater than or equal to about 0.2%, or greater than or equal to about 0.25%) when being irradiated with light of a wavelength of about 1.55 μm.

The electronic device may further include a third electrode facing the semiconductor layer and an insulation layer interposed between the semiconductor layer and the third electrode.

The electronic device may be configured to have a field effect hole mobility of greater than or equal to about $2.5 \times 10^{-3}$ square centimeters per volt-second ($cm^2/Vs$).

The electronic device may be configured to have a field effect electron mobility of greater than or equal to about 1 square centimeter per volt-second ($cm^2/Vs$).

The electronic device may be configured to have a field effect electron mobility of greater than or equal to about 2 square centimeters per volt-second ($cm^2/Vs$).

The electronic device may be configured to have a field effect electron mobility of greater than or equal to about 4 square centimeters per volt-second ($cm^2/Vs$).

The electronic device may be configured to have a field effect electron mobility of greater than or equal to about 5 square centimeters per volt-second ($cm^2/Vs$).

The electronic device may be configured to have a field effect electron mobility of greater than or equal to about 5.5 square centimeters per volt-second ($cm^2/Vs$).

The semiconductor layer may be in contact with the first electrode and the second electrode.

The electronic device may be a solar cell, a photodetector, a field effect transistor, a flash memory, or a photoelectric chemical device.

In an embodiment, a method of producing the aforementioned electronic device includes:

preparing a plurality of quantum dots;

forming a first electrode and a second electrode spaced apart from each other (e.g., on a substrate);

forming a semiconductor layer including the plurality of quantum dots between the first electrode and the second electrode;

wherein the preparing of the plurality of quantum dots includes:

reacting an indium halide and optionally a gallium compound with a trissylilamide compound of a Group VA element in an organic medium in the presence of a reducing agent (e.g., a hydride reducing agent) at a reaction temperature to synthesize quantum dots, the organic medium not including trioctylpohsphine; and after the synthesis of the quantum dot, injecting a post-treatment mixture including an indium halide and trioctylphosphine into the organic medium to treat the quantum dot as synthesized.

The reaction temperature may be greater than or equal to about 270° C.

The post-treatment mixture may be injected into the organic medium at a temperature of greater than or equal to about 200° C., greater than or equal to about 270° C., or the reaction temperature.

The organic medium may include a primary amine with a carbon number of at least 8. The organic medium may not include a tertiary amine.

The method may not include a size selection process for the quantum dot as synthesized and a standard deviation of the size of the produced quantum dots may be less than 15% of an average size.

The semiconductor layer including the aforementioned indium based quantum dots do not include a toxic heavy metal such as cadmium, lead, mercury and may exhibit enhanced optical and electrical properties, and thereby a device including the same may exhibit improved performance.

BRIEF DESCRIPTION OF THE DRAWINGS

FIG. 7 is a graph of source-drain current ($I_{DS}$ (amperes (A))) versus gate voltage ($V_G$ (volts (V))) showing the results of the electrical measurements of the devices (semiconductor layers) prepared in Experimental Example 1.

DETAILED DESCRIPTION

Figure 1:
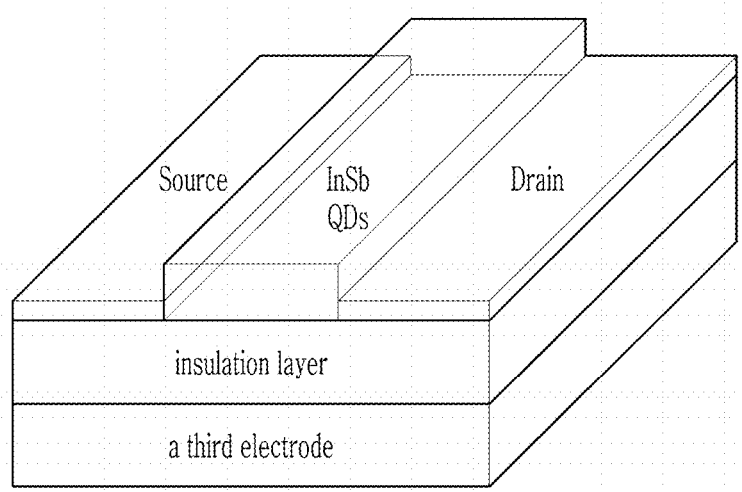
FIG. 1 is a schematic view of a device of an embodiment.

This disclosure will be described more fully hereinafter in the following detailed description, in which some but not all embodiments of this disclosure are described. This disclosure may be embodied in many different forms and is not be construed as limited to the embodiments set forth herein; rather, these embodiments are provided so that this disclosure will fully convey the scope of the invention to those skilled in the art. Thus, in some exemplary embodiments, well known technologies are not specifically explained. Unless otherwise defined, all terms used in the specification (including technical and scientific terms) may be used with meanings commonly understood by a person having ordinary knowledge in the art. Further, unless explicitly defined to the contrary, the terms defined in a generally-used dictionary are not ideally or excessively interpreted. In addition, unless explicitly described to the contrary, the word "comprise" and variations such as "comprises" or "comprising" will be understood to imply the inclusion of stated elements but not the exclusion of any other elements.

Unless specifically described to the contrary, a singular form includes a plural form.

As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. Unless specified otherwise, the term "or" means "and/or."

In the drawings, the thickness of layers, films, panels, regions, etc., are exaggerated for clarity. Like reference numerals designate like elements throughout the specification.

It will be understood that when a first element such as a layer, film, region, or substrate is referred to as being "on" a second element, it can be directly on the other element or intervening elements may also be present. In contrast, when an element is referred to as being "directly on" another element, there are no intervening elements present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "alkyl" refers to a linear or branched, saturated monovalent hydrocarbon group (e.g., methyl or hexyl, or the like). Unless otherwise provided, the alkyl group can have 1-60, or 1-30, or 1-16, or 1-6 carbon atoms, including any substituents.

As used herein, when a definition is not otherwise provided, the term "aliphatic group" refers to a linear or branched hydrocarbon group. The aliphatic group or hydrocarbon group, may be for example, alkyl, alkenyl, alkynyl or the like.

As used herein, "alkenyl" refers to a linear or branched monovalent hydrocarbon group having one or more carbon-carbon double bond. Unless otherwise indicated, the alkenyl group can have 1-60, or 1-30, or 1-16, or 1-6 carbon atoms, including any substituents.

As used herein, unless a definition is otherwise provided, "alkynyl" means a straight or branched chain, monovalent hydrocarbon group having at least one carbon-carbon triple bond (e.g., ethynyl). Unless otherwise indicated, the alkoxy group can have 1-60, or 1-30, or 1-16, or 1-6 carbon atoms, including any substituents.

In an embodiment, an electronic device includes a semiconductor layer including a plurality of quantum dots; and a first electrode and a second electrode spaced apart from each other. The semiconductor layer may be electrically connected to the first electrode and the second electrode.

The plurality of quantum dots included in the semiconductor layer do not include cadmium, lead, or mercury. The plurality of quantum dots include a Group IIIA-VA compound that includes a Group IIIA metal including indium and optionally gallium, aluminum, or a combination thereof and a Group VA element. The Group VA element includes antimony, arsenic, or a combination thereof. A molar ratio of the Group VA element with respect to the Group IIIA metal is greater than or equal to about 0.8:1, greater than or equal to about 0.9:1, or greater than or equal to about 1:1, or greater than or equal to about 1.1:1 and less than or equal to about 1.2:1, less than or equal to about 1.19:1, less than or equal to about 1.18:1, less than or equal to about 1.17:1, less than or equal to about 1.16:1, less than or equal to about 1.15:1, less than or equal to about 1.14:1, less than or equal to about 1.13:1, less than or equal to about 1.12:1, or less than or equal to about 1.11:1, less than or equal to about 1.1:1, less than or equal to about 1.09:1, less than or equal to about 1.08:1, less than or equal to about 1.07:1, less than or equal to about 1.06:1, or less than or equal to about 1.05:1.

A molar ratio may be determined by any suitable method such as an inductively coupled plasma-optical emission spectroscopy (ICP-OES), X-ray photoelectron spectroscopy, energy dispersive spectroscopic (EDS) analysis, or a combination thereof.

The plurality of quantum dots may include InSb, InAs, $InAs_xSb_{1-x}$, $In_xGa_{1-x}Sb$, $In_xGa_{1-x}As_ySb_{1-y}$, or a combination thereof wherein x is greater than 0 and less than 1.

CdS, CdSe, CdTe, PbS, PbSe, PbTe, HgS, HgSe, and HgTe include a toxic metal. A Group IIIA-VA compound quantum dot such as InP, InAs, InSb, GaP, GaAs, or GaSb has been researched but there is a technological challenge in a synthesis of a quantum dot having a desired property. A Group IIIA-VA compound quantum dot based on indium and antimony, arsenide, or a combination thereof has a narrow energy band gap and may absorb light of a relatively long wavelength (e.g., an infrared light of about 1,500 nm or longer). A semiconductor layer including Group IIIA-VA compound quantum dots based on indium and antimony, arsenide, or a combination thereof may find potential use in a solar cell, an image sensor, a light absorption layer of an infrared (IR) sensor, a channel material for a field effect transistor (FET), a light emitting to material for a near infrared (NIR) quantum dot (QD) light emitting diode (LED), a thermoelectric material, or the like.

Lead (Pb) or mercury (Hg) based quantum dots may be capable of absorbing light of a near infrared region. However, Pb or Hg based quantum dots include restricted elements under the Restriction of Hazardous Substances Directive, and thus may not be used in a large scale production for a commercial device due to problems that may be caused.

The plurality of quantum dots included in a semiconductor layer of an embodiment do not include cadmium, Pb, Hg, or a combination thereof, but may exhibit desired electrical properties (e.g., an increased carrier concentration) and optical/photoelectrical properties.

In an embodiment, the plurality of quantum dots may have a surface treated with a trioctylphosphine (TOP)-indium halide compound.

Except for indium phosphide, quantum dots (capable of absorbing light of a relatively long wavelength such as infrared light or near infra-red light) based on the indium and a Group VA element may encounter many challenging problems during synthesis thereof. For example, an InSb (indium antimonide) based quantum dot may be prepared using an indium amide having trioctylphosphine or oleylamine and an antimony amide. However, present inventors have found that volatility of the antimony precursor may cause serious problems in reproducibility. A size distribution of the quantum dots as prepared may be poor, and thus a size selection process may have to be carried out and a yield of the reaction/production may be insufficient.

An InSb quantum dot may be prepared using indium chloride dissolved in trioctylphosphine and antimony sililamide dissolved in toluene as a precursor and conducting a reaction therebetween in the presence of a superhydride (hereinafter, referred to as "co-reduction method"). However, according to the research of the present inventors, reproducibility problems may not be addressed and the quantum dot as prepared may have a poor size distribution, the yield may be low, and a relatively large amount of non-soluble side products may be produced.

In addition, the present inventors have found that when a silylamide of a Group VA element (e.g., antimony) is reacted with indium chloride as a precursor in an organic medium in the presence of a superhydride and the organic medium does not include trioctylphoshine, the quantum dots thus prepared may have improved size distribution and the aforementioned process problems (e.g., poor size distribution, reproducibility, and yield) may be addressed. The indium based quantum dot as prepared may be apt to aggregate and exhibit high resistance. Without wishing to be bound by any theory, it is believed that the prepared quantum dots may suffer from a relatively high degree of indium ion deficiency.

In the aforementioned semiconductor film, (for example, measured by ICP-OES or the like) the plurality of quantum dots may have a molar ratio of the Group VA element with respect to the Group IIIA metal (e.g., indium) that is greater than or equal to about 0.8:1, greater than or equal to about 0.9:1, greater than or equal to about 1:1, greater than or equal to about 1.01:1, greater than or equal to about 1.05:1, greater than or equal to about 1.1:1, greater than or equal to about 1.13:1, greater than or equal to about 1.14:1, or greater than or equal to about 1.15:1 and less than or equal to about 1.3:1, less than or equal to about 1.26:1, less than or equal to about 1.2:1, for example, less than or equal to about 1.19:1, less than or equal to about 1.18:1, less than or equal to about 1.17:1, less than or equal to about 1.16:1, less than or equal to about 1.15:1, less than or equal to about 1.14:1, less than or equal to about 1.13:1, less than or equal to about 1.12:1, less than or equal to about 1.11:1, less than or equal to about 1.1:1, less than or equal to about 1.09:1, less than or equal to about 1.08:1, less than or equal to about 1.07:1, less than or equal to about 1.06:1, or less than or equal to about 1.05:1. In the plurality of quantum dots, a molar ratio of the Group VA element with respect to indium may be greater than 1.12:1.

In order to have the aforementioned value, the plurality of quantum dots (for example, prepared according to the method described below) may be treated with an indium halide-trioctylphosphine, and thus, the plurality of quantum dots may have a surface treated with the trioctylphosphine-indium halide (e.g., indium chloride).

In the plurality of quantum dots, a molar ratio of the phosphorous with respect to the Group VA element may be greater than about 0.011:1, greater than or equal to about 0.012:1, greater than or equal to about 0.013:1, or greater than or equal to about 0.014:1, for example as determined by the EDS. A molar ratio of the phosphorous with respect to the Group VA element may be less than or equal to about 0.1:1, less than or equal to about 0.05:1, less than or equal to about 0.04:1, less than or equal to about 0.03:1, or less than or equal to about 0.02:1.

Even when they are not subject to a size selection process, the plurality quantum dots prepared may have an improved level of a particle size distribution. Therefore, the plurality of quantum dots may have a particle size distribution of less than 15%, for example, 14%, less than or equal to about 13%, less than or equal to about 12%, less than or equal to about 11%, less than or equal to about 10%, less than or equal to about 9%, less than or equal to about 8%, less than or equal to about 7%, less than or equal to about 6%, or less than or equal to about 5% of an average size thereof.

According to the aforementioned method, the plurality of quantum dots thus prepared may have an average size of greater than or equal to about 3 nm, greater than or equal to about 4 nm, greater than or equal to about 5 nm, greater than or equal to about 6 nm, or greater than or equal to about 6.5 nm. The plurality of quantum dots thus prepared may have an average size of less than or equal to about 20 nm, less than or equal to about 15 nm, less than or equal to about 14 nm, less than or equal to about 13 nm, less than or equal to about 12 nm, less than or equal to about 11 nm, less than or equal to about 10 nm, or less than or equal to about 9 nm.

Even without a size selection process, the plurality of quantum dots thus prepared may have exhibit a (for example relatively sharp) first absorption peak in a wavelength range of greater than or equal to about 1,300 nm, for example, greater than or equal to about 1,400 nm, greater than or equal to about 1,450 nm, or greater than or equal to about 1,500 nm, and less than or equal to about 1,800 nm, for example, less than or equal to about 1,700 nm, less than or equal to about 1,600 nm, or less than or equal to about 1,550 nm in a UV-Vis absorption spectroscopy analysis. When the excitation is made by light of 620 nm, a photoluminescent spectrum of the plurality of quantum dots may have a photoluminescent peak in a region of an infrared region (e.g., greater than about 700 nm, for example, greater than or equal to about 1,000 nm, greater than or equal to about 1,100 nm, greater than or equal to about 1,200 nm, greater than or equal to about 1,300 nm, greater than or equal to about 1,400 nm, or greater than or equal to about 1,500 nm and less than or equal to about 2,000 nm, less than or equal to about 1,900 nm, or less than or equal to about 1,800 nm. In an absorption spectroscopy, the quantum dots may exhibit an absorption peak at a wavelength greater than or equal to about 900 nm (greater than or equal to about 1,000 nm) and less than or equal to about 1,600 nm (or less than or equal to about 1,560 nm). The quantum dots may exhibit a photoluminescent peak at a wavelength of greater than or equal to about 1,000 nm (greater than or equal to about 1,100 nm) and less than or equal to about 1,700 nm (or less than or equal to about 1,600 nm).

The Group VA element may include antimony (Sb) and arsenic (As).

In the quantum dots, a molar ratio of the antimony with respect to the arsenic may be greater than or equal to about 0.1:1, greater than or equal to about 0.11:1, greater than or equal to about 0.12:1, or greater than or equal to about 0.13:1 and less than or equal to about 9:1, less than or equal to about 8.5:1, less than or equal to about 8:1, or less than or equal to about 7.5:1, for example, as determined by an energy dispersive spectroscopic analysis.

The quantum dots may have a peak (e.g., a (111) diffraction peak) in a range of greater than about 23 degrees and less than about 25 degrees in 2 theta of a X-ray diffraction spectrum.

The quantum dots of the embodiments may include a primary amine including a C6 to C30 aliphatic hydrocarbon (e.g., oleyl amine) and a monocarboxylic acid including a C6 to C30 aliphatic hydrocarbon on a surface thereof. The quantum dots may not exhibit peaks that are assigned to a hydrogen atom closest to the amine or carboxylic group of the primary amine compound and the mono carboxylic acid compound.

In an electronic device of an embodiment, the semiconductor layer (or the plurality of quantum dots) may include an alkylammonium halide (e.g., alkylammonium iodide), a carboxylic acid compound including a thiol group, a thiocyanic acid (SCN) compound, $Na_2S$, an alkali azide, or a combination thereof on a surface thereof. By the surface treating with the aforementioned compound, the distance between adjacent quantum dots may be reduced and thereby a carrier transport between the quantum dots may be enhanced.

Manners of the surface treating of the quantum dots (or the semiconductor layer) are not particularly limited. In a non-limiting embodiment, after a semiconductor layer of a plurality of quantum dots is formed, an organic solution of any of the aforementioned ligand compound may be applied onto the semiconductor layer. The surface treatment may be carried out by mixing the plurality of quantum dots with a first organic solution of the aforementioned ligand compound and stirring the same with an optional heating. The surface treatment may be carried out by preparing a second organic solution including the plurality of quantum dots and an organic solvent that is not miscible with the solvent of the first organic solution and contacting the same with the first organic solution of the aforementioned ligand compound to perform an phase transfer wherein the quantum dots transferred to the first organic solution and the ligand exchange occurs. The surface treatment may be carried out by firstly transferring the quantum dots into the organic solution containing the aforementioned ligand compounds, forming a semiconductor layer of plurality of quantum dots, and applying another solution of the aforementioned ligand compound onto the semiconductor layer.

The alkylammonium iodide may include tetrabutylammonium iodide. The carboxylic acid compound including a thiol group may include mercapto propionic acid. The thiocyanate (SCN) compound may include $NH_4SCN$. The alkali azide compound may include sodium azide.

The semiconductor layer may be electrically connected to the first electrode, the second electrode, or a combination thereof.

A thickness of the semiconductor layer may be greater than or equal to about 10 nm, for example, greater than or equal to about 20 nm, greater than or equal to about 30 nm, greater than or equal to about 40 nm, greater than or equal to about 50 nm, or greater than or equal to about 100 nm. A thickness of the semiconductor layer may be less than or equal to about 1 micrometer (um), for example, less than or equal to about 900 nm, less than or equal to about 800 nm, less than or equal to about 700 nm, less than or equal to about 600 nm, less than or equal to about 500 nm, less than or equal to about 400 nm, less than or equal to about 300 nm, less than or equal to about 200 nm, less than or equal to about 100 nm, or less than or equal to about 60 nm.

In a device of an embodiment, the semiconductor layer may absorb near infrared light of a wavelength of greater than or equal to about 1 μm, for example, greater than or equal to about 1,100 nm, greater than or equal to about 1,200 nm, greater than or equal to about 1,300 nm, greater than or equal to about 1,400 nm, or greater than or equal to about 1,500 nm to generate a photocurrent.

The semiconductor layer may have a field effect hole mobility of greater than or equal to about $10^{-4}$ $cm^2/Vs$, for example, greater than or equal to about $1\times10^{-3}$ $cm^2/Vs$.

The semiconductor layer may have a field effect electron mobility of greater than or equal to about 5.5 $cm^2/Vs$.

In a device of an embodiment, the semiconductor layer may be configured to have a responsivity of greater than or equal to about $3\times10^{-3}$ A/W when it is irradiated with light of a wavelength of about 1.55 μm.

In a device of an embodiment, the semiconductor layer may be configured to show an external quantum efficiency of greater than or equal to about $2\times10^{-3}$ (i.e., greater than or equal to about 0.2% or greater than or equal to about 0.25%) when it is irradiated with light of a wavelength of about 1.55 μm.

In an embodiment, the electronic device may be a field effect transistor. The electronic device may include a third electrode facing the semiconductor layer and may further include an insulation layer interposed between the semiconductor layer and the third electrode. The semiconductor layer may contact with the insulation layer. The electronic device may be configured to have a field effect hole mobility of greater than or equal to about $10^{-4}$ $cm^2/Vs$, for example, greater than or equal to about $1\times10^{-3}$ $cm^2/Vs$ or greater than or equal to about $2.5\times10^{-3}$. The electronic device may be configured to have a field effect hole mobility of greater than or equal to about 0.5 $cm^2/Vs$. The electronic device may be configured to have a field effect hole mobility of greater than or equal to about 1 $cm^2/Vs$. The electronic device may be configured to have a field effect hole mobility of greater than or equal to about 4 $cm^2/Vs$. The electronic device may be configured to have a field effect hole mobility of greater than or equal to about 5 $cm^2/Vs$. The electronic device may be configured to have a field effect hole mobility of greater than or equal to about 5.5 $cm^2/Vs$. The electronic device may be configured to have a field effect electron mobility of greater than or equal to about 0.5 $cm^2/Vs$, greater than or equal to about 1 $cm^2/Vs$, greater than or equal to about 2 $cm^2/Vs$, greater than or equal to about 3 $cm^2/Vs$, greater than or equal to about 4 $cm^2/Vs$, or greater than or equal to about 5 $cm^2/Vs$, or greater than or equal to about 5.5 $cm^2/Vs$.

In an embodiment, the semiconductor layer may contact with the first electrode and the second electrode. The first electrode and the second electrode may be disposed in an interdigitated form. The spacing of the first electrode and the second electrode may be greater than or equal to about 1 μm, for example, greater than or equal to about 2 μm, greater than or equal to about 3 μm, greater than or equal to about 4 μm, or greater than or equal to about 5 μm.

The electronic device may be a solar cell, a photodetector, a field effect transistor, a flash memory, or a photoelectric chemical device.

Hereinafter, a structure of an electronic device of an embodiment may be explained in detail referring to the figures.

FIG. 1 is a perspective view of an electronic device of an embodiment. Referring to FIG. 1, a semiconductor layer (for example, including indium antimonide quantum dots (QDs)) may be disposed between a first electrode (e.g., a source electrode) and a second electrode (e.g., a drain electrode). The electronic device of an embodiment further includes a third electrode (e.g., a gate electrode) facing the semiconductor layer and an insulation layer may be disposed between the semiconductor layer and the third electrode. A surface of the semiconductor layer may be treated with the aforementioned organic and/or inorganic compound.

Materials for the first electrode and the second electrode are not particularly limited and may be selected appropriately. Examples of the first electrode and the second electrode may include a metal such as gold, nickel, aluminum, platinum, or the like, a conductive polymer, and a conductive ink, but are not limited thereto. A thickness of the first electrode or the second electrode may be selected appropriately. For example, a thickness of the first electrode (or the second electrode) may be greater than or equal to about 40 nm, for example, about 100 nm and less than or equal to about 400 μm, but is not limited thereto.

Materials of a third electrode (e.g., a gate electrode) are not particularly limited and selected appropriately. For example, a third electrode may include a metal thin film, a conductive polymer film, a conductive film prepared from a conductive ink or paste, a doped silicon, or the like, but is not limited thereto. Examples of the third electrode may include aluminum, silver, chrome, indium tin oxide, poly(3, 4-ethylene dioxythiopene) doped with polystyrene sulfonic acid (PSS:PEDOT), carbon black/graphite in a polymeric binder, or a conductive ink/paste such as a colloidal silver dispersion or an Ag ink, but are not limited thereto. A third electrode layer may be prepared by vacuum deposition or sputtering of a metal or a conductive metal oxide, a spin coating of a conductive polymer solution or a conductive ink, a coating via casing or printing, or a doping of substrate, or the like. A thickness of a third electrode is not particularly limited and may be selected appropriately. For example, a thickness of a third electrode including a metal thin film may be greater than or equal to about 10 nm and less than or equal to about 200 nm. A thickness of a third electrode including a polymeric conductor may be greater than or equal to about 1 μm and less than or equal to about 10 μm. A gate electrode including a carbon composite such as a carbon nanotube (CNT) may have a thickness of greater than or equal to about 100 nm (e.g., 1 μm or greater) and less than or equal to about 10 μm. However, it is not limited thereto.

An insulation layer may separate the third electrode from the first electrode, the second electrode, and the semiconductor film (30). The insulation layer may include a thin film of an inorganic material or a film of an organic polymer. Examples of the inorganic material may include a silicon oxide, a silicon nitride, an aluminum oxide, a barium titanate, and a zirconium titanate, or a combination thereof but are not limited thereto. Examples of an organic polymer may include a polyester, a polycarbonate, a poly(vinylphenol), a polyimide, a polystyrene, a poly(methacrylate), a polyacrylate, an epoxy resin, and the like but are not limited thereto. A thickness of the insulation layer may vary with a dielectric constant of the insulation material, and is not particularly limited. For example, the insulation layer may have a thickness of greater than or equal to about 10 nm, for example, greater than or equal to about 50 nm, or greater than or equal to about 100 nm, but it is not limited thereto. The thickness of the insulation layer may be less than or equal to about 2,000 nm, for example, less than or equal to about 500 nm, but is not limited thereto. A conductivity of the insulation layer may be less than or equal to about $10^{-12}$ siemens per centimeter (S/cm), but is not limited thereto.

The first electrode, the semiconductor layer, the insulation layer, and the second electrode may be formed in any order, which is not particularly limited.

Figure 2:
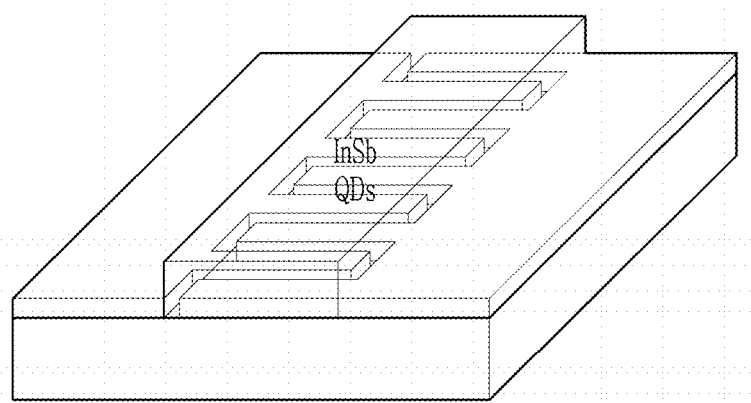
FIG. 2 is a schematic view of a device of an embodiment.

FIG. 2 shows a perspective view of an electronic device of an embodiment. Referring to FIG. 2, the electronic device of the embodiment includes a first electrode and a second electrode spaced apart from each other and a semiconductor layer is disposed between the first and the second electrodes. The semiconductor layer may contact with the first and the second electrodes. Details of the electrodes and the semiconductor layer are the same as set forth above.

Figure 3A:
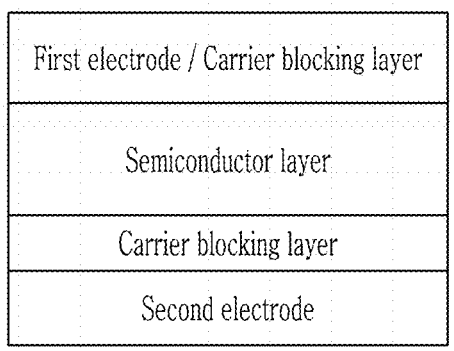
FIG. 3A is a cross-sectional schematic view of a device of an embodiment.
Figure 3B:
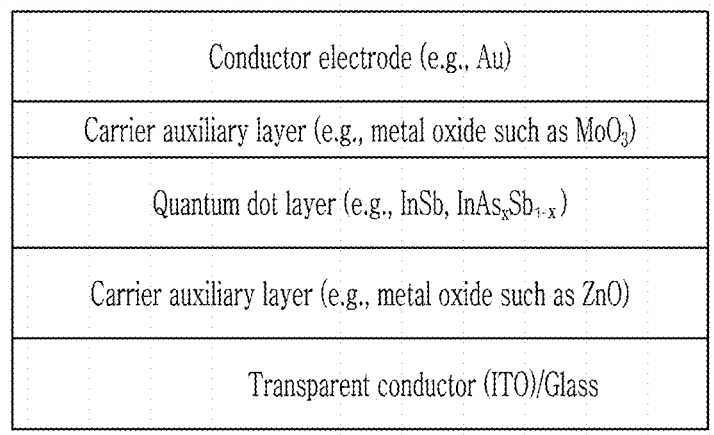
FIG. 3B is a cross-sectional schematic view of a device of an embodiment.

Each of FIG. 3A and FIG. 3B is a cross-sectional schematic view of an electronic device of an embodiment. Referring to FIG. 3A and FIG. 3B, the device of the embodiment includes a semiconductor layer disposed between a first electrode (e.g., indium thin oxide) and a second electrode (e.g., aluminum). The device may form a metal-semiconductor Schottky Contact or a heterojunction photodiode. The semiconductor layer may include a p-type characteristic layer. The semiconductor layer may have an n-type characteristic layer. The semiconductor layer may have an i-type characteristic layer. The semiconductor layer may have multi-layered structure wherein each of the layers may be an n-type, i-type, p-type, or a combination thereof. A carrier auxiliary layer (e.g., a carrier transport layer, a carrier injection layer, or a carrier blocking layer, for example, including PEDOT:PSS, a metal oxide, LiF, or the like) may be disposed between the semiconductor layer and the first electrode. A carrier blocking layer (e.g., LiF) may be disposed between the semiconductor layer and the second electrode. A device of FIG. 3A or FIG. 3B may include a Schottky diode.

In an embodiment, a method of producing the aforementioned electronic device includes:

preparing a plurality of quantum dots;

forming a first electrode and a second electrode spaced apart from each other (e.g., on a substrate);

forming a semiconductor layer including the plurality of quantum dots between the first electrode and the second electrode;

wherein the preparing of the plurality of quantum dots includes:

reacting a Group IIIA metal compound (e.g., an indium halide and optionally a gallium compound) with a trissylil-amide compound of a Group VA element in an organic medium in the presence of a reducing agent (e.g., a hydride reducing agent) at a reaction temperature to synthesize quantum dots; and treating the quantum dot as synthesized with a post-treatment mixture including an indium halide and trioctylphosphine by injecting the same into the organic medium, provided that during the formation of the quantum dots, the organic medium (or the reaction medium) does not include trioctylphohsphine.

Hereinafter, the method is explained with an example wherein an indium halide is used as a Group IIIA metal compound, but it is not limited thereto.

In the preparation of the plurality of quantum dots, the indium halide may be indium chloride, indium bromide, indium iodide, indium fluoride, or a combination thereof. The gallium compound may include a gallium halide, for example, gallium chloride, gallium bromide, gallium iodide, gallium fluoride, or a combination thereof. The trissylilamide compound of the Group VA element may include $As[Si(NR_3)_2]_3$, $Sb[Si(NR_3)_2]_3$, or a combination thereof (wherein, R is a C1 to C10 alkyl group).

A molar ratio of the trissylilamide compound of the Group VA element with respect to the Group IIIA metal (e.g., indium) halide may be greater than or equal to about 0.1:1 and less than or equal to about 3:1. A molar ratio of the gallium compound with respect to the indium halide may be selected considering a composition of the final quantum dot.

The reducing agent may include a hydride compound. The hydride compound may be a superhydride. The hydride compound may include lithium aluminum hydride; trialkoxyaluminumhydride such as $LiAl(OtBu)_3H$, $LiAl(OMe)_3H$, or the like; aluminum hydride such as sodium bis(2-methoxyethoxy)aluminum hydride, diisobutylaluminum hydride; sodium borohydride; lithium borohydride; borane; sodium cyanoborohydride; lithium trialkylborohydride such as lithium triethylborohydride; or a combination thereof.

The reaction may be carried out at a temperature of greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 275° C., greater than or equal to about 280° C., greater than or equal to about 285° C., greater than or equal to about 290° C., greater than or equal to about 295° C., greater than or equal to about 300° C., greater than or equal to about 305° C., greater than or equal to about 310° C., or greater than or equal to about 315° C., greater than or equal to about 320° C., greater than or equal to about 325° C., greater than or equal to about 330° C., greater than or equal to about 335° C., or greater than or equal to about 340° C.

The reaction may be carried out at a temperature of less than or equal to about 380° C., for example, less than or equal to about 360° C., less than or equal to about 340° C., or less than or equal to about 330° C.

In an embodiment, the post-treatment mixture may be injected into the organic medium at a temperature of greater than or equal to about 200° C., greater than or equal to about 220° C., greater than or equal to about 270° C., or a temperature approximately equal to the reaction temperature. The post-treatment mixture may be injected into the organic medium at a temperature of less than or equal to about 330° C., for example, less than or equal to about 320° C., less than or equal to about 310° C., less than or equal to about 300° C., less than or equal to about 290° C., less than or equal to about 280° C., less than or equal to about 270° C., less than or equal to about 260° C., less than or equal to about 250° C., less than or equal to about 240° C., less than or equal to about 230° C., or less than or equal to about 225° C. In an embodiment, the post-treatment compound may be injected at a temperature at least 5° C. higher, or at least 10° C. higher than the reaction temperature. In an embodiment, the post-treatment compound may be injected at a temperature at least 10° C. lower, at least 20° C. lower, or at least 30° C. lower than the reaction temperature.

The organic medium may include an aliphatic primary amine of a carbon number of 8 or higher, for example, 010 or higher alkyl or alkenyl amine. The organic medium may include an oleyl amine. The organic medium may not include a tertiary amine (e.g., trioctylamine).

As described above, the conventional synthesis of an indium—Group VA element based quantum dot has drawbacks in light of the reproducibility or the size distribution. However, the method of the synthesizing the aforementioned quantum dots may produce quantum dots with improved size distribution even without carrying out a size-selection process, may reduce the amount of insoluble byproducts, and may ensure improved reproducibility. Without wishing to be bound by any theory, it is believed that the aforementioned effects may be achieved by the exclusion of the trioctylphosphine during the formation of the quantum dot particle using the reducing agent.

However, the present inventors have also found that the exclusion of the trioctylphosphine during the synthesis of the quantum dot may adversely affect the dispersability of the quantum dots after a predetermined time period. In addition, according to the research of the present inventors, such a phenomenon may be related with the increase of the Group VA element (e.g., the antimony) with respect to the Group IIIA metal (e.g., indium) in the prepared to quantum dot. For example, the quantum dot prepared via the reaction in the presence of the reducing agent in the absence of the use of the trioctylphosphine has a molar ratio of the Group VA element with respect to the Group IIIA metal (e.g., indium) that is greater than or equal to about 1.3:1, for example, greater than or equal to about 1.4:1.

Therefore, in an embodiment, the process of preparing the plurality of quantum dots includes injecting a post-treatment mixture including indium halide-trioctylphosphine into the reaction medium. By the aforementioned post treatment, the molar ratio of the Group VA element with respect to the Group IIIA metal (e.g., indium) in the plurality of quantum dots may be less than or equal to about 1.29:1, less than or equal to about 1.28:1, less than or equal to about 1.27:1, less than or equal to about 1.26:1, less than or equal to about 1.25:1, less than or equal to about 1.24:1, less than or equal to about 1.23:1, less than or equal to about 1.22:1, less than or equal to about 1.21:1, less than or equal to about 1.2:1, less than or 1.2:1, less than or equal to about 1.19:1, less than or equal to about 1.18:1, less than or equal to about 1.15:1, less than or equal to about 1.13:1 or less than or equal to about 1.12:1. In the plurality of quantum dots, the molar ratio of the Group VA element with respect to the Group IIIA metal (e.g., indium) may be greater than or equal to about 0.8:1, for example, greater than or equal to about 0.9:1, greater than or equal to about 1:1, greater than or equal to about 1.1:1, greater than or equal to about 1.12:1, greater than or equal to about 1.13:1, greater than or equal to about 1.14:1 or greater than or equal to about 1.15:1.

The post-treatment makes it possible for the plurality of quantum dots to exhibit improved optical properties. In an embodiment, the plurality of quantum dots may have a sharp UV-Vis absorption peak and they may exhibit infrared luminance (e.g., of a wavelength of from about 600 nm to about 1,400 nm) when being irradiated with the light having a wavelength of the absorption peak or lower. Without wishing to be bound by any theory, the decrease of the molar ratio of the Group VA element may suppress the fusion or the necking between the particles, enabling to reduce the nonradiative recombination). The method of the embodiment may not entail the size selection process and the standard deviation of the size of the prepared quantum dots may be less than about 15% of the average size thereof.

The formation of the first electrode and the second electrode may be carried out in a method without any particular limitation, and may be selected considering materials of the first and the second electrodes and types of a desired device. For example, the formation of the first electrode and the second electrode may involve the deposition, the coating or the like. In some embodiment, after a first electrode is formed, a semiconductor layer may be formed on or over it, and a second electrode is formed on or over the semiconductor layer. In an embodiment, a first and a second electrodes are formed (e.g., on a substrate) and a semiconductor layer may be formed therebetween.

The formation of the semiconductor layer (e.g., on or over the first electrode or between the first electrode and the second electrode) may include obtaining a dispersion wherein the prepared plurality of quantum dots in an appropriate organic solvent and forming a film from the dispersion via a coating, printing, or any appropriate manner.

The production of the aforementioned device may further include treating the plurality of quantum dots in order for the semiconductor layer to have an alkylammonium iodide, a carboxylic acid compound including a thiol group (e.g., mercaptopropionic acid), a thiocyanate (SCN) compound, $Na_2S$, an alkali azide, or a combination thereof on a surface thereof.

The treating of the plurality of quantum dots may include forming a dispersion prepared by (e.g., prior to the formation of the semiconductor layer) dispersing the plurality of quantum dots in an organic solvent and adding the aforementioned compound to the dispersion. The surface-treating of the plurality of quantum dots may be carried out by the process involving the phase transfer as explained above. The treating of the plurality of quantum dots may be carried out in a solid state. For example, the treating of the plurality of quantum dots may include contacting the semiconductor layer with an organic solution including the aforementioned compound. The treating of the plurality of quantum dots may include both the phase transfer process explained above in the solution phase prior to the formation of the semiconductor layer and a solid state process explained above after followed the formation of the semiconductor layer (e.g., $Na_2S$ solution ligand exchange, semiconductor layer formation, and a $NaN_3$ solid-state hybrid ligand).

Hereinafter, the embodiments are illustrated in more detail with reference to specific examples. However, they are exemplary and the embodiments are not limited thereto.

EXAMPLES

Analysis Method

1. Photoluminescence Analysis A photoluminescence (PL) spectrum of the produced quantum dots are obtained using a PL spectrometer (Model name: FLS1000 manufactured by Edinburgh Instruments).

2. Absorption Spectroscopy Analysis

Absorption spectroscopy analysis is performed using a spectrometer (Model name: Cary 5000 manufactured by Agilent) to obtain an absorption spectrum.

3. Electrical and Photoconductivity Measurement

The electrical and photoconductivity measurements are performed by using a semiconductor parameter analyzer (Model name: 4156C manufactured by Agilent).

4. Inductively Coupled Plasma (ICP) Analysis

An inductively coupled plasma-optical emission spectroscopy (ICP-OES) analysis is performed using a Spectro Genesis spectrometer.

5. Transmission Electron Microscopy (TEM) and Energy Dispersive X-Ray Spectroscopy (EDS) Analysis Transmission electron microscopy analysis and EDS analysis are made using TEM (Model name: JEM1400 manufactured by JEOL).

Production Example 1

A trioctylphosphine (TOP)—$InCl_3$ solution is prepared by adding indium chloride in trioctylphosphine. 5 millimeters (mL) of 2.0 molar (M) $LiEt_3BH$ solution in dioctyl ether is also prepared. In a three-neck flask including 12 mL of anhydrous degassed oleylamine, a premixed solution containing 1 millimole (mmol) of $InCl_3$ and 0.5 mmol of $Sb[N(Si(Me)_3)_2]_3$ in 10 mL of oleyl amine (and 0.5 mL of toluene) are injected and the $LiEt_3BH$ solution is injected to the flask.

Then, the flask is heated to a reaction temperature of 280° C. at a rate of about 3° C./minute (min), and is kept at the same temperature for 30 minutes. After completion of the reaction, a TOP-$InCl_3$ solution is injected to the flask at a temperature of 280° C. and is kept for 30 minutes.

5 mL of oleic acid (OA) is added to the crude solution to neutralize the excess of the super-hydride, oleate ligands being attached to a surface of the nanocrystal. Then, the crude solution is centrifuged and the nanocrystals are recovered and dispersed in toluene.

Figure 5:
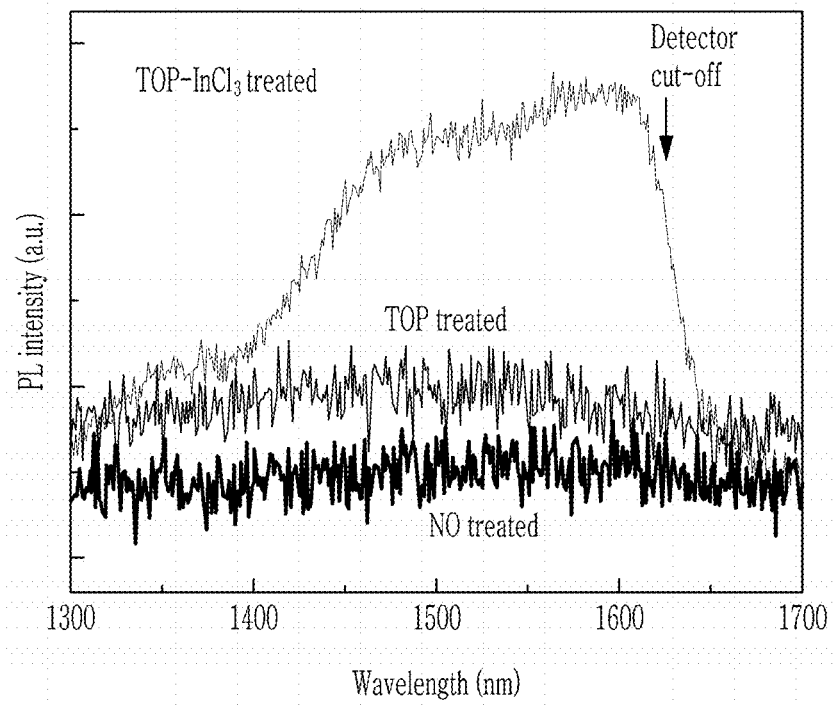
FIG. 5 shows a graph of photoluminescent (PL) intensity (arbitrary units (a.u.)) versus wavelength (nanometers (nm)) of the results of a photoluminescence analysis of the quantum dots prepared in Preparation Example 1, Preparation Comparative Example 1, and Preparation Comparative Example 3.
Figure 6A:
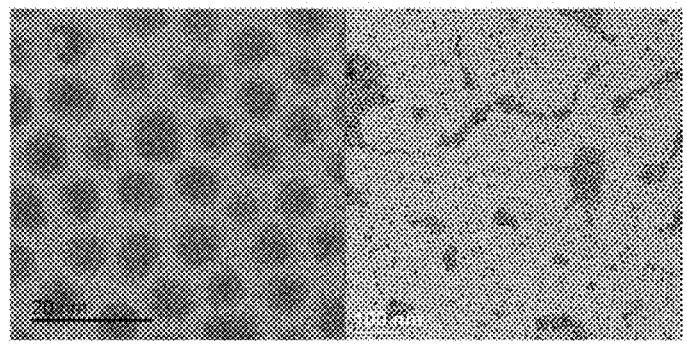
FIG. 6A, FIG. 6B, FIG. 6C, and FIG. 6D are transmission electron microscopic images of the quantum dots prepared in Preparation Example 1, Preparation Comparative Example 1, and Preparation Comparative Example 2.

2. For the prepared quantum dots, an ultraviolet-visible (UV-Vis) spectroscopic analysis, a photoluminescent spectroscopic analysis, an ICP-OES analysis, and a transmission electron microscopic analysis are made and the results are summarized in Table 1 and FIG. 6A, FIG. 4, and FIG. 5.

Production Comparative Example 1

1. The nanocrystals are prepared in the same manner as set forth in Production Example 1 except for not using the TOP-$InCl_3$ solution after the completion of the reaction. The nanocrystals as prepared are dispersed in toluene.

2. For the prepared quantum dots, a UV-Vis-NIR spectroscopic analysis, a photoluminescent spectroscopic analysis, an ICP-OES analysis, and a transmission electron microscopic analysis are made and the results are summarized in Table 1 and FIG. 6B, FIG. 4, and FIG. 5.

3. The dispersability of the toluene dispersion of the prepared nanocrystals are observed in two weeks and in one month, respectively. The results confirm that a severe aggregation occurs for the dispersion.

Production Comparative Example 2

1. The nanocrystals are prepared in the same manner as set forth in Production Example 1 except for injecting a trioctylphosphine solution of the $InCl_3$ and the oleylamine solution of the $Sb[N(Si(Me)_3)_2]_3$ to a three-neck flask including 12 mL of anhydrous degassed oleylamine and not using the TOP-$InCl_3$ solution after the completion of the reaction. The nanocrystals as prepared are dispersed in toluene.

2. For the prepared quantum dots, an ICP-OES analysis, and a transmission electron microscopic analysis are made and the results are summarized in Table 1 and FIG. 6C.

Production Comparative Example 3

1. The nanocrystals are prepared in the same manner as set forth in Production Example 1 except for injecting trioctylphosphine instead of the TOP-InCl$_3$ solution after the completion of the reaction. The nanocrystals as prepared are dispersed in toluene.

2. For the prepared quantum dots, a UV-Vis-NIR spectroscopic analysis, a photoluminescent spectroscopic analysis, an ICP-OES analysis, and a transmission electron microscopic analysis are made and the results are summarized in Table 1 and FIG. 6D, FIG. 4, and FIG. 5.

Figure 4:
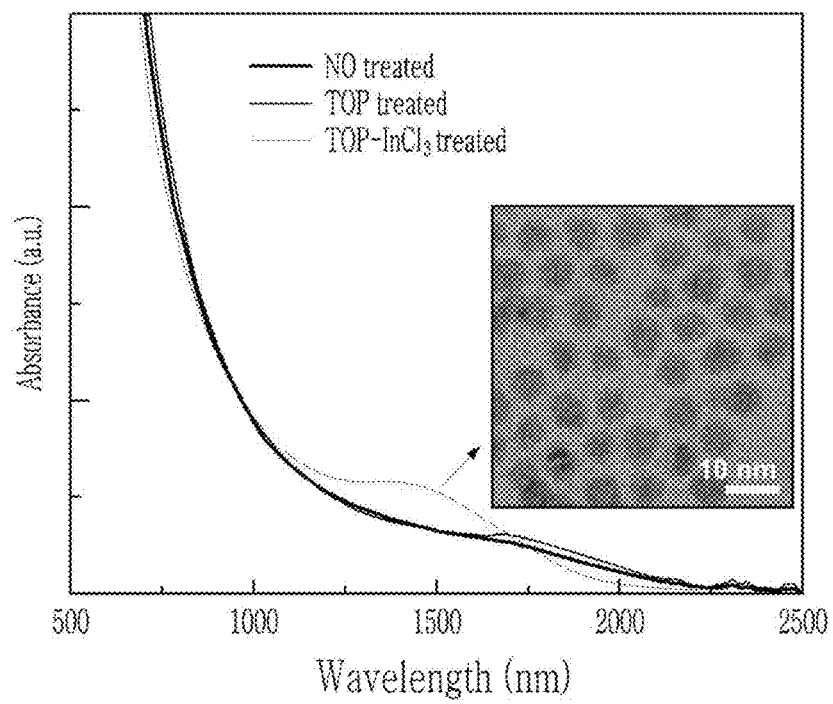
FIG. 4 is an ultraviolet-visible (UV-VIS-NIR) absorption spectrum of the quantum dots prepared in Preparation Example 1, Preparation Comparative Example 1, and Preparation Comparative Example 3.

The results of FIG. 3 and FIG. 4 indicate that the TOP-InCl$_3$ post-growth treatment may enhance the optical properties of the InSb quantum dots (QDs). Specifically, referring to FIG. 3 and FIG. 4, the InSb QDs of Production Example 1 may exhibit the optical properties as greatly improved in comparison with those of the QDs of Production Example 1 and Production Example 3. The QDs of Production Comparative Example 1 and Production Comparative Example 3 may be fused, exhibiting a wide absorption tail until 2,200 nanometers (nm) in an absorption spectrum. In contrast, the TOP-InCl$_3$ treated InSb QDs of Production Example 1 may exhibit a relatively sharp absorption peak at a wavelength of about 1,500 nm, and exhibit the infrared (IR) emission of the InSb QD at the excitation of the light at 620 nm.

Referring to Table 1, the quantum dots prepared in the Production Comparative Example 1, Production Comparative Example 2, Production Comparative Example 3 have the molar ratio of the antimony with respect to the indium that is greater than 1.2:1, while the quantum dots of Production Example 1 have the molar ratio of the antimony with respect to indium of less than 1.2:1.

TABLE 1

| TEM-EDS results | Molar ratio of Sb to In | Molar ratio of In to Sb |
| --- | --- | --- |
| Production Example 1 (TOP-InCl$_3$) | 1.13:1 | 0.015:1 |
| Production Comp. Example 1 (no TOP) | 1.47:1 | 0:1 |
| Production Comp. Example 2 (TOP at RT) | 1.30:1 | 0.011:1 |
| Production Comp. Example 3 (TOP at 280) | 1.25:1 | 0.02:1 |

The TEM analysis results of FIG. 6A to FIG. 6D confirm the followings. The TEM Image of FIG. 6A confirms that the TOP-InCl$_3$ treated InSb QDs have highly uniform spherical shapes. The relatively low magnification image indicate that these particles are well-dispersed and form well-ordered assemblies due to the good ligand passivation. In addition, the post-growth TOP-InCl$_3$ treatment maintains colloidal stability over observation times of more than a few months.

Figure 6B:
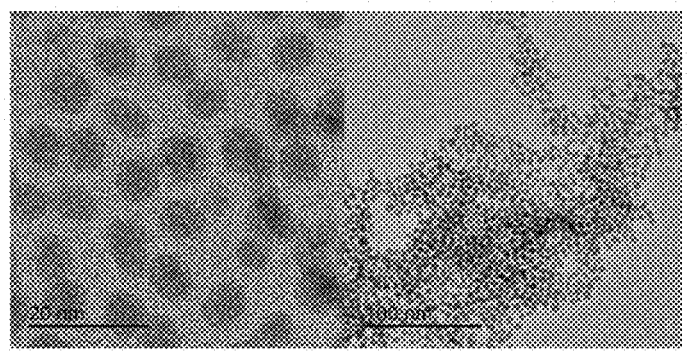

The TEM images of untreated InSb QDs (Production Comparative (Comp.) Example 1) in FIG. 6B show that particles are aggregated. Fused particles are confirmed in the higher magnification image of FIG. 6B.

Figure 6C:
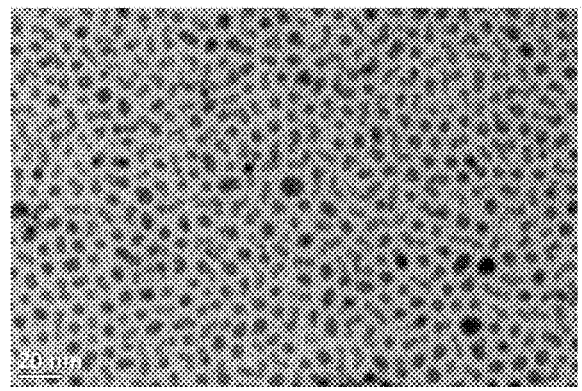

FIG. 6C shows InSb QDs synthesized in Production Comp. Example 2 with the addition of TOP before the heating process. Somewhat elongated particles are observed. The TOP may result in the formation of the nanorod or the nanowire, and the wurtzite InSb may be synthesized in the presence of the TOP. It is believed that the poor reproducibility and irregular shaped particles also originate from incomplete reaction of TOP with InCl$_3$. The elimination of TOP method may yield more uniform spherical particles.

Figure 6D:
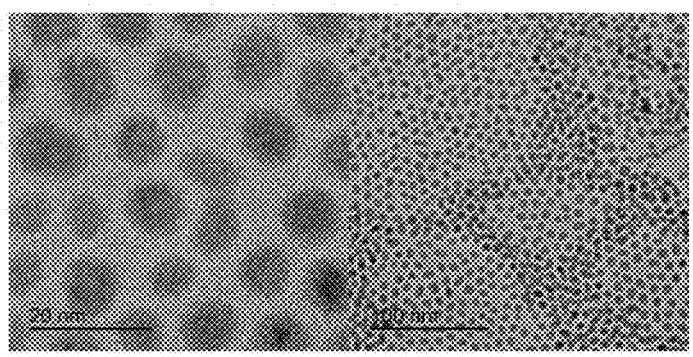

In FIG. 6D, in case of the TOP treated InSb QDs, slightly fused particles and elongated particles are also observed.

Production Comp. Example 4

1. The nanocrystals are prepared in the same manner as set forth in Production Example 1 except for injecting a post-treatment solution obtained by dissolving the indium chloride in the oleylamine instead of the TOP-InCl$_3$ solution after the completion of the reaction.

2. The ICP-OES analysis is made for the prepared quantum dots and the results confirm that the molar ratio of the antimony with respect to the indium is greater than that of the quantum dots prepared in Production Example 1.

Experimental Example 1: Production and Characteristic Analysis of Field Effect Transistor (FET)

1. The quantum dots of Production Example 1 and the quantum dots of Production Comp. Example 1 are used to prepare a FET having a structure shown in FIG. 1 to make a research on the effects of the post-treatment of the InSb QDs.

For the ligand exchange of the surface of the quantum dot film, tetrabutylammonium iodide (TBAI) is used, and Au contacts are vapor-deposited as a source electrode and a drain electrode. Specifically, tetrabutylammonium iodide is added to a quantum dot dispersion to obtain the TBAI capped InSb quantum dots. A doped Si substrate that has a SiO$_2$ gate oxide having a predetermined thickness is prepared, and the Au electrodes are vapor-deposited on the gate oxide, and between the electrodes, a film of the TBAI capped InSb quantum dots is formed.

Fabrication of the device is carried out under a dry nitrogen atmosphere and the deposited nanocrystal film is dried at a predetermined temperature for a solvent removal.

2. Electrical properties of the fabricated device are measured and the results are shown in FIG. 7. FIG. 7 shows the source-drain current versus gate voltage ($I_{DS}$-$V_G$) characteristics of the devices. Referring to FIG. 7, in comparison with the device including the quantum dots prepared in Production Comparative Example 1, the device including the quantum dot of Production Example 1 may exhibit an $I_{DS}$ increased by about 1,000 times. The $I_{DS}$ and the electrical properties of the device including the quantum dots of Production Example 1 may increases about 10 times in comparison with the device including the quantum dots prepared in Production Comp. Example 3.

From the $I_{DS}$-$V_G$ curves, a hole mobility (square centimeters per volt-second (cm$^2$/Vs)) is calculated and the results are shown in Table 2:

TABLE 2

| TOP-InCl$_3$ | $3 \times 10^{-3}$ cm$^2$/Vs |
| TOP | $9 \times 10^{-5}$ cm$^2$/Vs |
| No treatment | $10^{-9}$ cm$^2$/Vs |

In comparison with the device including the quantum dots prepared in Production Comp. Example 1, the device including the quantum dots prepared in Production Example 1 may achieve an increase in hole mobility of $3 \times 10^6$ times. In comparison with the device including the quantum dots prepared in Production Comp. Example 3, the device including the quantum dots prepared in Production Example 1 may achieve an increase in hole mobility of 33 times, which is higher than a reported value.

Without wishing to be bound by any theory, it is believed that the enhanced electrical characteristics are possibly due to passivation of surface traps by the TOP-InCl$_3$ treatment.

Figure 8A:
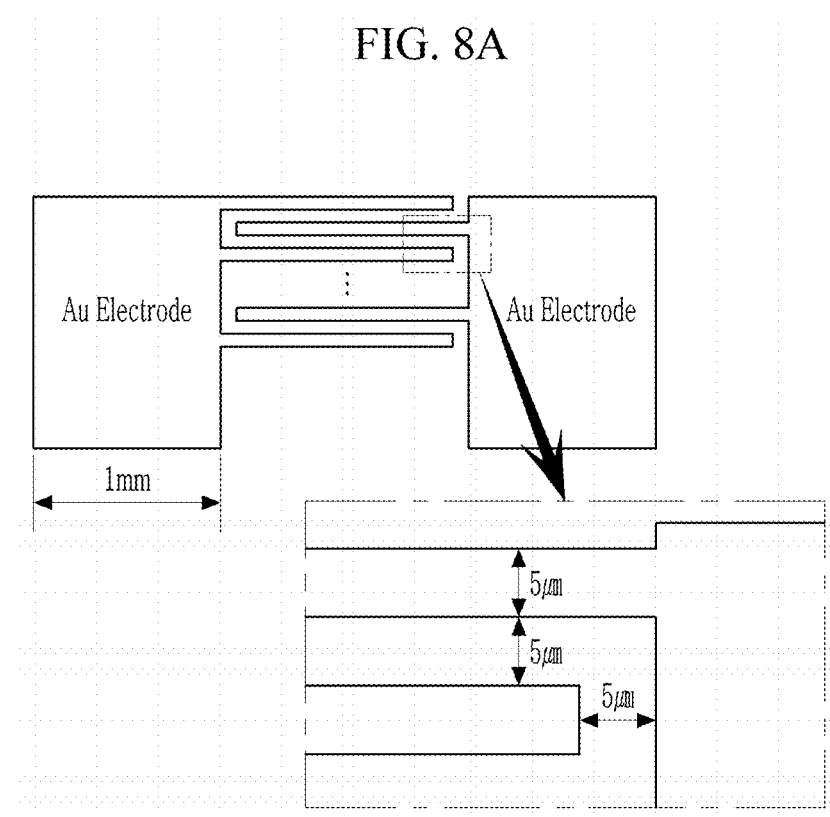
FIG. 8A is a schematic illustration of the first and second electrodes of the device prepared in Experimental Example 2.

Experimental Example 2: Preparation of a photoconductor having a 5 micrometers (μm) or 10 μm space and Photoconductivity measurement thereof under 1.55 μm laser illumination In order to measure the photoconductivity of InSb QD films under 1.55 μm illumination, a device illustrated in FIG. 2 is fabricated. (The electrodes include interdigitated electrodes illustrated in FIG. 8A and having a 5 μm spacing as shown or a 10 μm spacing)

The Au electrode pattern is formed on a Si substrate via a photolithography process and the InSb QDs are spin-cast thereon, acting as a photo-conductor absorbing 1.55 μm wavelength light from the IR laser.

The current is collected at a constant 5 volt (V) direct current (DC) voltage across the electrodes and the IR laser is turned on and off every 30 seconds (s). InSb QDs without post-growth treatment (Production Comp. Ex 1), with TOP treatment (Production Comp. Ex 3) and with TOP-InCl$_3$ treatment (Production Ex 1) are deposited on the 5-μm spacing electrodes. The TBAI ligand exchange is applied in the solid state to improve conductivity of the QD film.

Figure 8B:
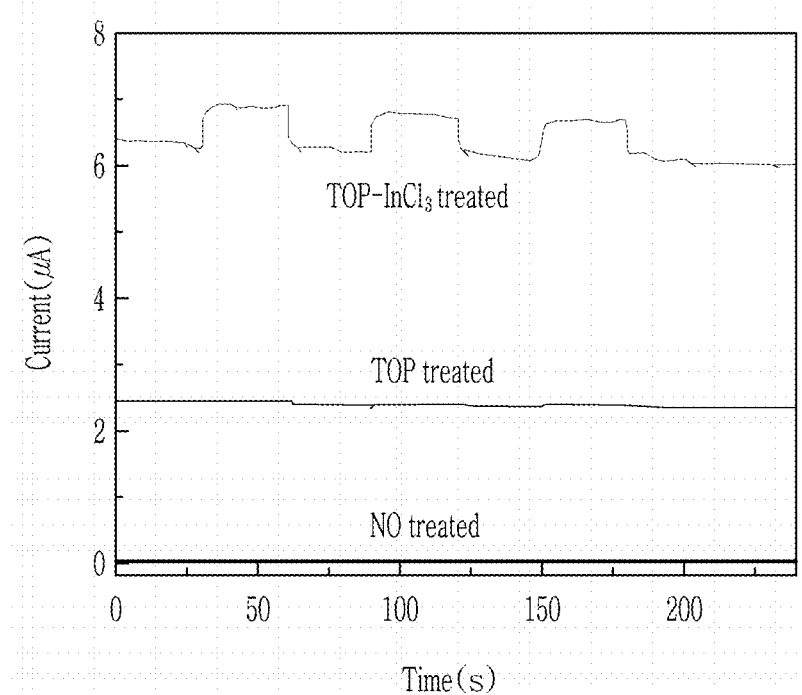
FIG. 8B is a graph illustrating the results of measuring the photoconductivity of the device prepared in Experimental Example 2.

FIG. 8B shows the current with and without illumination. After TOP treatment, the QD film (Production Comp. Ex 3) has higher current compared to no treatment (Production Comp. Ex 1), but the photoresponse is still weak.

However, with TOP-InCl$_3$ treatment (Production Ex 1), both dark and light currents significantly increase and the photoresponse to 1.55 μm laser light is clearly observed.

From the photoconductivity result, the responsivity of TOP-InCl$_3$ treated InSb QD film is $R_{1.55\ \mu m}=3.4\times 10^{-3}$ amperes per watt (A/W) and external quantum yield is $EQE_{1.55\ \mu m}=2.7\times 10^{-3}$ (i.e., 0.27%).

Experimental Example 3

1. The organic ligands introduced during synthesis is replaced with more compact ligands to improve carrier transport for the application of photodetectors. In this experiment, the effects of different solid-state ligand exchanges on the optical and electrical properties of InSb QD films are investigated.

Figure 9:
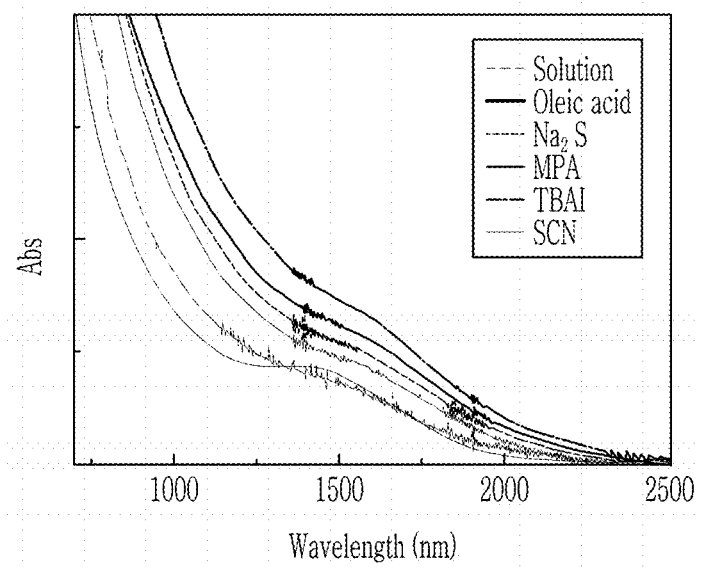
FIG. 9 is a graph of absorbance (Abs (arbitrary units (a.u.))) versus wavelength (nanometers (nm)) showing an absorption spectrum of the quantum dot films after the ligand exchange in Experimental Example 3.

As an inorganic ligand, Na$_2$S, tetrabutylammonium iodide (TBAI) and NH$_4$SCN, and as an organic ligands, 3-mercaptopropionic acid (MPA), ethanedithiol (EDT), and ethylenediamine (EDA), have been applied to InSb QDs synthesized in Preparation Example 1. FIG. 9 shows the excitonic absorption peak red shifts and broadens after both inorganic and organic ligand exchanges, which indicates that the interparticle coupling is enhanced. It is also believed that the ligand exchange also modifies the energy levels of InSb QD films.

2. Effect of different ligands on optical and electrical properties

Using the InSb QDs prepared in Production Example 1 and carrying out different types of a ligand exchange, FETs each having a structure illustrated in FIG. 1 are prepared to study the influence of different ligand exchange chemistries on charge transport. All devices exhibit p-type characteristics.

Figure 10:
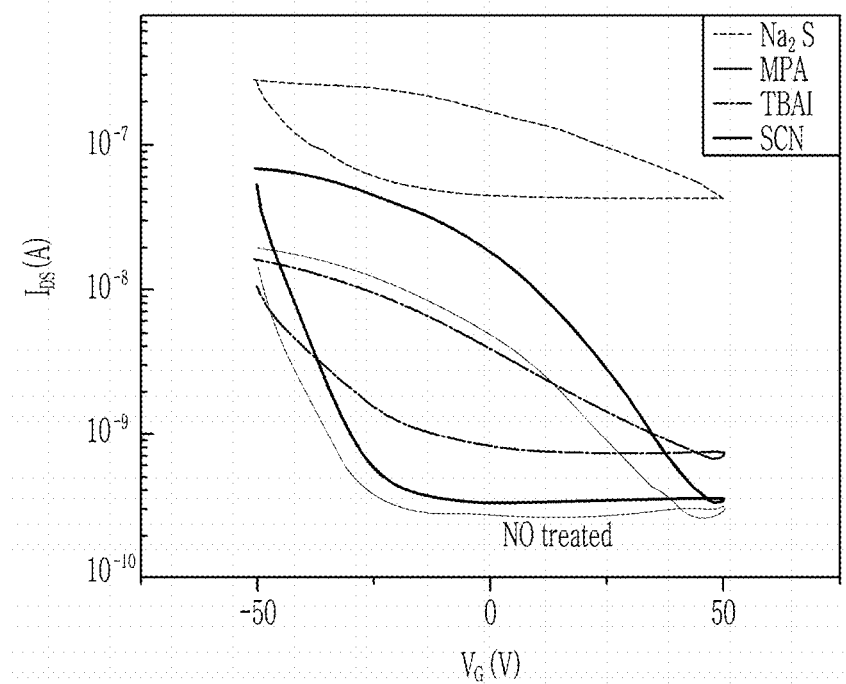
FIG. 10 is a graph of source-drain current ($I_{DS}$ (A)) versus gate voltage ($V_G$ (V)) showing the results of the electrical property analysis of a device (a semiconductor layer) prepared in Experimental Example 3.

For the devices prepared by using different solid ligand exchanges, the electrical properties (transfer characteristics and field effect hole mobilities) are measured and the results are shown in FIG. 10 and Table 3.

TABLE 3

| Field effect hole mobility (cm$^2$/Vs) | |
| --- | --- |
| Na$_2$S | $2 \times 10^{-3}$ cm$^2$/Vs |
| MPA | $3 \times 10^{-4}$ cm$^2$/Vs |
| TBAI | $1 \times 10^{-4}$ cm$^2$/Vs |
| SCN | $1 \times 10^{-3}$ cm$^2$/Vs |

The results of FIG. 10 and Table 3 confirm that Na$_2$S or NH$_4$SCN result in higher hole mobility (~$10^{-3}$ cm$^2$/Vs) than that of MPA or TBAI treated devices (~$10^{-4}$ cm$^2$/Vs). The NH$_4$SCN exchange has a larger >$10^2$ current modulation, than the <10 current modulation for Na$_2$S, consistent with a lower concentration of p-doping.

Figure 11A:
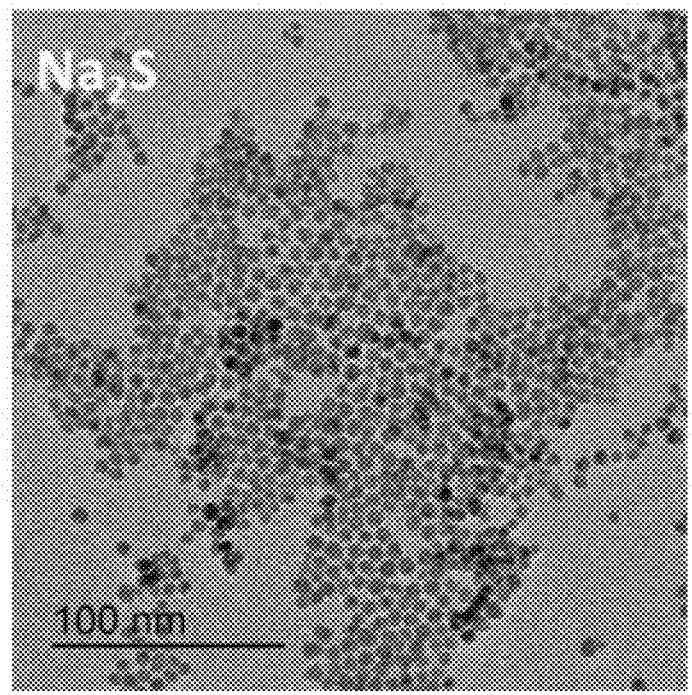
FIG. 11A, FIG. 11B, and FIG. 11C are transmission electron microscopic images of the quantum dots included in a semiconductor layer in Experimental Example 3.
Figure 11B:
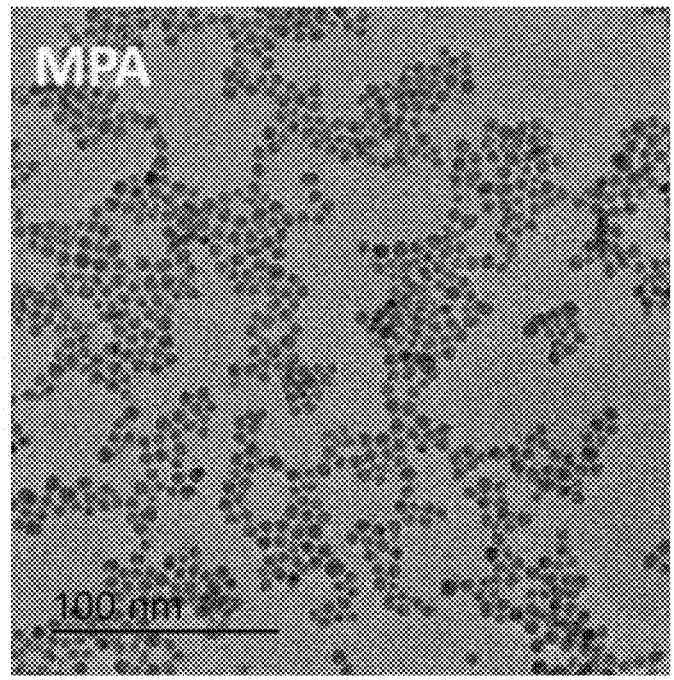
Figure 11C:
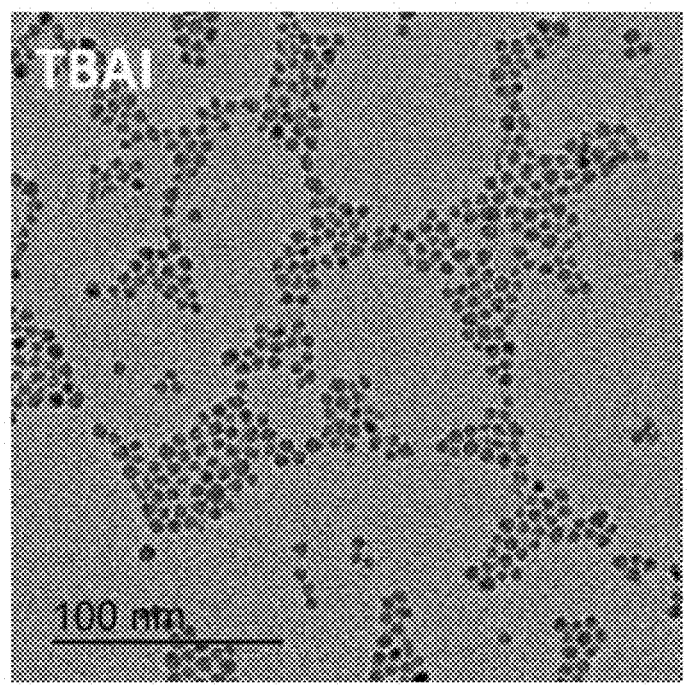

To further characterize the QD film after ligand exchange, a TEM analysis is made for each of the films capped by Na$_2$S, MPA and TBAI and the results are shown in FIG. 11A, FIG. 11B, and FIG. 11c. It is confirmed that the interparticle distance of Na$_2$S treated QDs is shorter than that of the other two cases, consistent with higher mobility measured in FETs.

From a TEM-EDS analysis, it is also observed that the stoichiometry of InSb QDs is altered by the ligand exchange and the results are summarized in Table 4.

TABLE 4

| TEM-EDS results | Molar ratio of antimony with respect to indium | Molar ratio of phosphorous with respect to antimony |
| --- | --- | --- |
| Device including Na$_2$S exchanged semiconductor film | 1.18:1 | 0.0118:1 |
| Device including MPA exchanged semiconductor film | 1.178:1 | 0.023:1 |
| Device including TBAI exchanged semiconductor film | 1.127:1 | 0.004:1 |

The results show that the indium amount may be changed with respect to the ligand exchange and TBAI treated films have the highest In to Sb molar ratio among the three, suggesting that less In is removed during the ligand exchange process.

Experimental Example 4

InSb QD photoconductors each having a structure illustrated in FIG. 2 are prepared using the quantum dots of Production Example 1 with conducting surface exchange of different ligands (Na$_2$S, TBAI, NH$_4$SCN, MPA, EDT, and EDA).

Figure 12:
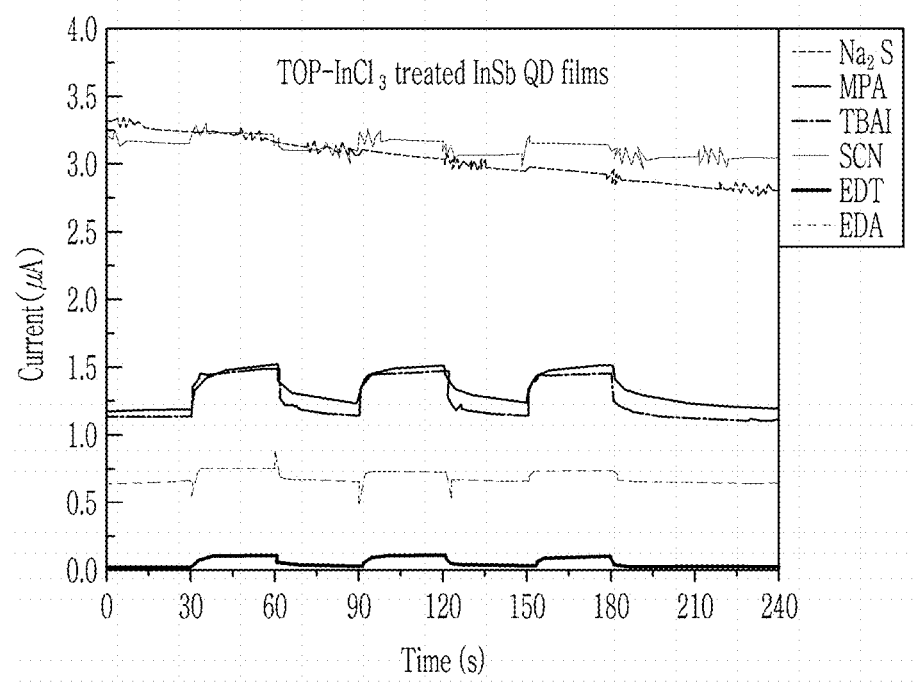
FIG. 12 is a graph of current (microamperes (μA)) versus time (seconds (s)) illustrating the results of measuring the photoconductivity of the device prepared in Experimental Example 4.

On the 10-μm spacing Au electrodes, the current-voltage (I-V) characteristics are obtained with and without 1.55 μm laser illumination and the results are shown in FIG. 12.

FIG. 12 shows photoconductivity of InSb QD film having 10-μm spacing Au electrodes on a substrate. FIG. 12 confirmed that InSb QD films treated by Na$_2$S exhibit the highest currents both in the dark and under illumination, consistent with higher hole mobility in FETs, but the photoresponse of the device is relatively low as seen by the relatively low photo gain ($I_{light}/I_{dark}$).

However, NH$_4$SCN treated films exhibit a similar current level and a better photoresponse, than Na$_2$S treated devices, also consistent with the lower p-doping suggested by the FET characteristics.

The EDT and EDA treated samples have relatively low dark and relatively light currents, while the films treated by TBAI and MPA exhibit higher currents under illumination but relatively low dark current. Notably, TBAI treated films exhibit faster response time than the MPA samples, which is more promising as a candidate photodetector material.

Experimental Example 5: Production and Characteristic Analysis of InAs QD Field Effect Transistors (FETs)

InAs quantum dots are made by the method described by the Production Example 1 except that $AsCl_3$-oleylamine solution is used as the group V precursor instead of $Sb[N(Si(Me)_3)_2]_3$ and the injection of TOP-$InCl_3$ step is not performed. FETs are prepared having a structure shown in FIG. 1 to make a research on the effects of ligand exchange of the InAs QDs.

For the solid-state ligand exchange of the surface of the InAs QD film, a solution of $Na_2S$ in methanol is applied on spin-cast InAs QD thin film. Three times of wash of the QD film is performed with pristine methanol.

For the solution phase ligand exchange of the InAs QD surface, $Na_2S$ is dissolved in formamide to be in contact with the QD dispersion in toluene. After agitating the mixture of the two solutions, QDs are transferred into the formamide phase capped by $S^{2-}$ when the ligand exchange is complete. Pristine toluene and acetonitrile are used to purify the QD dispersion and ensure them to be dispersed in n,n-dimethylformamide.

For a solution- and solid-state hybrid ligand exchange process, the InAs QD dispersion is firstly exchanged the ligand with $Na_2S$ in the solution phase as described above, and spin-cast into a semiconductor thin film on the substrate, and then treated by the $NaN_3$ solution in methanol in the solid-state.

To fabricate FET devices, doped Si substrates that have a $SiO_2$ gate oxide having a predetermined thickness is prepared. A semiconductor film is formed by performing solid-state, solution or hybrid ligand exchange of InAs QDs on the Si substrate. In and Au contacts are vapor-deposited sequentially as a source electrode and a drain electrode.

Fabrication of the device is carried out under a dry nitrogen atmosphere and the deposited nanocrystal film is dried at a predetermined temperature for a solvent removal.

Figure 13:
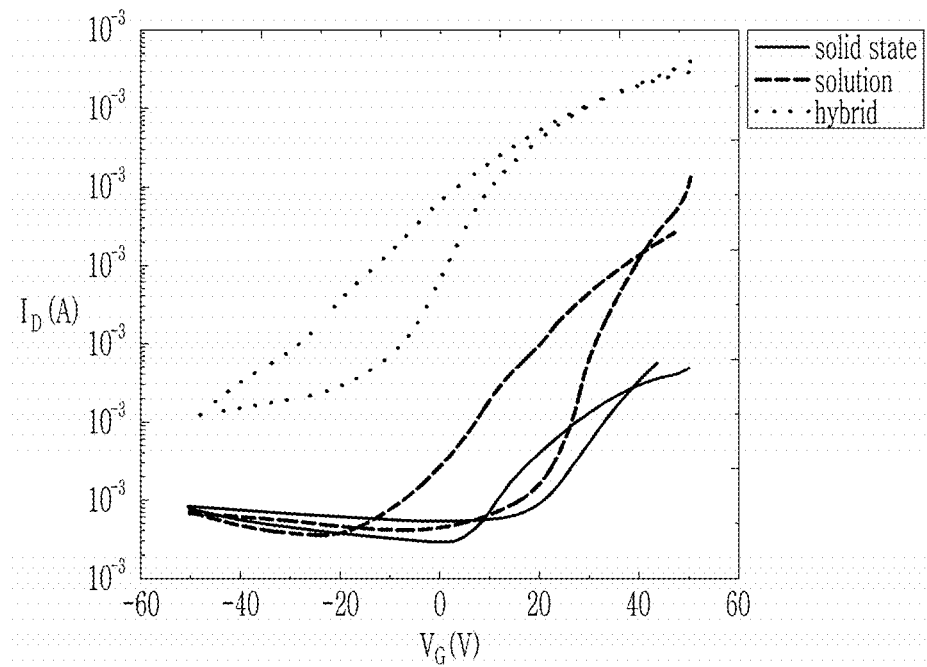
FIG. 13 is a graph of source-drain current ($I_{DS}$ (A)) versus gate voltage ($V_G$ (V)) showing the results of the electrical property analysis of devices (semiconductor layers) prepared by different ligand exchange approaches in Experimental Example 5.

Electrical properties of the fabricated devices are measured and the results are shown in FIG. 13. FIG. 13 shows the source-drain current versus gate voltage ($I_{DS}$-$V_G$) characteristics of the devices. Referring to FIG. 13, in comparison with the device prepared by the solid-state ligand exchange, the device fabricated with solution and hybrid ligand exchange may exhibit an $I_{DS}$ ($V_G$=50 V) increase by about 100 and 10,000 times, respectively.

From the $I_{DS}$-$V_G$ curves, the electron mobility (square centimeters per volt-second (cm²/Vs)) is calculated and the results are shown in Table 5:

TABLE 5

| | |
|---|---|
| $Na_2S$ solid-state ligand exchange | $3.2 \times 10^{-3}$ cm²/Vs |
| $Na_2S$ solution ligand exchange | 0.25 cm²/Vs |
| $Na_2S$ solution and $NaN_3$ solid-state hybrid ligand exchange | 5.5 cm²/Vs |

In comparison with the device prepared by the solid-state ligand exchange, the device includes a solution ligand exchange may achieve an increase in electron mobility of 78 times. In comparison with the device prepared by the solid-state ligand exchange, the device fabricated by the hybrid ligand exchange may achieve an increase in electron mobility of 1700 times.

The hybrid ligand exchange process does not involve explosive and corrosive solvents, such as hydrazine. All of the ligand compounds are commercially available.

Without wishing to be bound by any theory, it is believed that the enhanced electrical characteristics are possibly due to reduced interparticle distance after the ligand exchange and improved doping by the sulfur enrichment.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electronic device comprising:
    a semiconductor layer comprising a plurality of quantum dots; and
    a first electrode and a second electrode spaced apart from each other;
    wherein the plurality of quantum dots comprise a Group IIIA-VA compound comprising a Group IIIA metal and a Group VA element, and the plurality of quantum dots are surface treated with trioctylphosphine-indium halide,
    wherein the Group IIIA metal comprises indium, and optionally gallium, and the Group VA element comprises antimony, arsenic, or a combination thereof,
    wherein a molar ratio of the Group VA element with respect to the Group IIIA metal is less than or equal to about 1:2:1,
    wherein the semiconductor layer is disposed between the first electrode and the second electrode, and
    wherein the plurality of quantum dots comprise InSb, $InAs_xSb_{1-x}$, $In_xGa_{1-x}Sb$, $In_xGa_{1-x}As_ySb_{1-y}$, or a combination thereof, wherein x is greater than 0 and less than 1 and y is greater than 0 and less than 1.

2. The electronic device of claim 1, wherein the semiconductor layer comprises an alkylammonium halide, a carboxylic acid compound comprising a thiol group, a thiocyanic acid compound, alkali metal sulfide, an alkali azide or a combination thereof.

3. The electronic device of claim 2, wherein the alkylammonium halide comprises tetrabutylammonium iodide, the carboxylic acid compound comprising a thiol group comprises mercapto propionic acid, the thiocyanic acid compound comprises $NH_4SCN$, the alkali metal sulfide comprises $Na_2S$, and the alkali azide compound comprises sodium azide.

4. The electronic device of claim 1, wherein the molar ratio of the Group VA element with respect to the Group IIIA metal is greater than 1:1.

5. An electronic device comprising:
    a semiconductor layer comprising a plurality of quantum dots; and
    a first electrode and a second electrode spaced apart from each other;
    wherein the plurality of quantum dots do not comprise cadmium, lead, or mercury,
    wherein the plurality of quantum dots comprise a Group IIIA-VA compound comprising a Group IIIA metal and a Group VA element, wherein the Group IIIA metal comprises indium and optionally gallium, wherein the Group VA element comprises antimony, arsenic, or a combination thereof, wherein a molar ratio of the Group VA element with respect to the Group IIIA metal is less than or equal to about 1.2:1, wherein the semiconductor layer is disposed between the first electrode and the second electrode, wherein the plurality of quantum dots further comprise phosphorous, and wherein a molar ratio of the phosphorous with respect to the antimony, arsenic, or combination thereof is greater than about 0.011:1.

6. The electronic device of claim 1, wherein the plurality of quantum dots has a standard deviation of a size of less than about 15% of an average size thereof.

7. The electronic device of claim 1, wherein the plurality of quantum dots has a standard deviation of a size of less than about 10% of an average size thereof.

8. The electronic device of claim 5, wherein the molar ratio of the Group VA element with respect to the Group IIIA metal is greater than 1:1.

9. The electronic device of claim 1, wherein the semiconductor layer is configured to exhibit a responsivity of greater than or equal to about $3 \times 10^{-3}$ amperes per watt when being irradiated with light of a wavelength of about 1.55 micrometers.

10. The electronic device particle of claim 1, wherein the semiconductor layer is configured to exhibit an external quantum efficiency of greater than or equal to about 0.2% when being irradiated with light of a wavelength of about 1.55 micrometers.

11. The electronic device of claim 1, wherein the electronic device further comprises a third electrode facing the semiconductor layer and an insulation layer interposed between the semiconductor layer and the third electrode.

12. A field effect transistor comprising:
a semiconductor layer comprising a plurality of quantum dots; and
a first electrode and a second electrode spaced apart from each other;
wherein the plurality of quantum dots comprise a Group IIIA-VA compund comprising a Group IIIA metal and a Group VA element,
wherein the Group IIIA metal comprises indium, and optionally gallium, and the Group VA element comprises antimony, arsenic, or a combination thereof,
wherein a molar ratio of the Group VA element with respect to the Group IIIA metal is greater than 1:1 and less than or equal to about 1.2:1,
wherein the semiconductor layer is disposed between the first electrode and the second electrode,
wherein the field effect transistor further comprises a third electrode facing the semiconductor layer and an insulation layer interposed between the semiconductor layer and the third electrode, and wherein the insulation layer separates the third electrode from the first electrode.

13. The field effect transistor of claim 12, wherein the electronic device is configured to have a field effect electron mobility of greater than or equal to about 1 square centimeter per volt-second.

14. The electronic device of claim 1, wherein the semiconductor layer is in contact with the first electrode and the second electrode.

15. The field effect transistor of claim 12, wherein the electronic device is configured to have a field effect hole mobility of greater than or equal to about $2.5 \times 10^{-3}$ square centimeters per volt-second.

16. A method of producing an electronic device, which comprises:
preparing a plurality of quantum dots;
forming a first electrode and a second electrode spaced apart from each other on a substrate; and
forming a semiconductor layer comprising the plurality of quantum dots between the first electrode and the second electrode;
wherein the preparing of the plurality of quantum dots comprises
reacting an indium halide and optionally a gallium compound with a trisilylamide compound of a Group VA element in an organic medium in the presence of a reducing agent at a reaction temperature to form the plurality of quantum dots, the organic medium not comprising trioctylphosphine, and
after forming the plurality of quantum dots, injecting a post-treatment mixture comprising an indium halide and trioctylphosphine into the organic medium to treat the plurality of quantum dots,
wherein the plurality of quantum dots
comprise a Group IIIA-VA compound comprising a Group IIIA metal comprising indium and optionally gallium and a Group VA element comprising antimony, arsenic, or a combination thereof, wherein a molar ratio of the Group VA element with respect to the Group IIIA metal is less than or equal to about 1.2:1, and
comprise InSb, $InAs_xSb_{1-x}$, $In_xGa_{1-x}Sb$, $In_xGa_{1-x}As_ySb_{1-y}$, or a combination thereof, wherein x is greater than 0 and less than 1 and y is greater than 0 and less than 1.

17. The method of claim 16, wherein the reaction temperature is greater than or equal to about 270° C.

18. The method of claim 16, wherein the post-treatment mixture is injected into the organic medium at a temperature of less than or equal to the reaction temperature and greater than or equal to about 200° C.

19. The method of claim 16, wherein the organic medium comprises a primary amine with a carbon number of at least 8.

20. The method of claim 16, wherein the organic medium does not comprise a tertiary amine.

21. The method of claim 16, wherein the method does not comprise a size selection process for the plurality of quantum dots and a standard deviation of the size of the plurality of quantum dots is less than 15% of an average size thereof.

* * * * *